(12) United States Patent
Wu et al.

(10) Patent No.: US 10,727,205 B2
(45) Date of Patent: Jul. 28, 2020

(54) HYBRID BONDING TECHNOLOGY FOR STACKING INTEGRATED CIRCUITS

(71) Applicant: Taiwan Semiconductor Manufacturing Co., Ltd., Hsin-Chu (TW)

(72) Inventors: Kuo-Ming Wu, Zhubei (TW); Ching-Chun Wang, Tainan (TW); Dun-Nian Yaung, Taipei (TW); Hsing-Chih Lin, Tainan (TW); Jen-Cheng Liu, Hsin-Chu (TW); Min-Feng Kao, Chiayi (TW); Yung-Lung Lin, Taichung (TW); Shih-Han Huang, Kaohsiung (TW); I-Nan Chen, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/998,455

(22) Filed: Aug. 15, 2018

(65) Prior Publication Data

US 2020/0058617 A1 Feb. 20, 2020

(51) Int. Cl.
| H01L 25/065 | (2006.01) |
| H01L 23/528 | (2006.01) |
| H01L 23/48 | (2006.01) |
| H01L 23/532 | (2006.01) |
| H01L 25/00 | (2006.01) |
| H01L 23/00 | (2006.01) |

(52) U.S. Cl.
CPC ........ *H01L 25/0657* (2013.01); *H01L 23/481* (2013.01); *H01L 23/528* (2013.01); *H01L 23/53209* (2013.01); *H01L 24/33* (2013.01); *H01L 24/83* (2013.01); *H01L 25/50* (2013.01)

(58) Field of Classification Search
CPC ............ H01L 21/76898; H01L 23/481; H01L 25/0657; H01L 2224/73103–73104; H01L 2224/9211
See application file for complete search history.

(56) References Cited

U.S. PATENT DOCUMENTS

2007/0207592 A1* 9/2007 Lu ................... H01L 21/6835
438/455
2015/0318263 A1 11/2015 Yu et al.

* cited by examiner

*Primary Examiner* — Daniel P Shook
(74) *Attorney, Agent, or Firm* — Eschweiler & Potashnik, LLC

(57) ABSTRACT

A three-dimensional (3D) integrated circuit (IC) is provided. In some embodiments, a second IC die is bonded to a first IC die by a first bonding structure. The first bonding structure contacts a first interconnect structure of the first IC die and a second interconnection structure of the second IC die, and has a first portion and a second portion hybrid bonded together. A third IC die is bonded to the second IC die by a third bonding structure. The third bonding structure comprises a second TSV (through substrate via) disposed through the second substrate of the second IC die and includes varies bonding structures according to varies embodiments of the invention.

20 Claims, 14 Drawing Sheets

HYBRID BONDING TECHNOLOGY FOR STACKING INTEGRATED CIRCUITS

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 3:
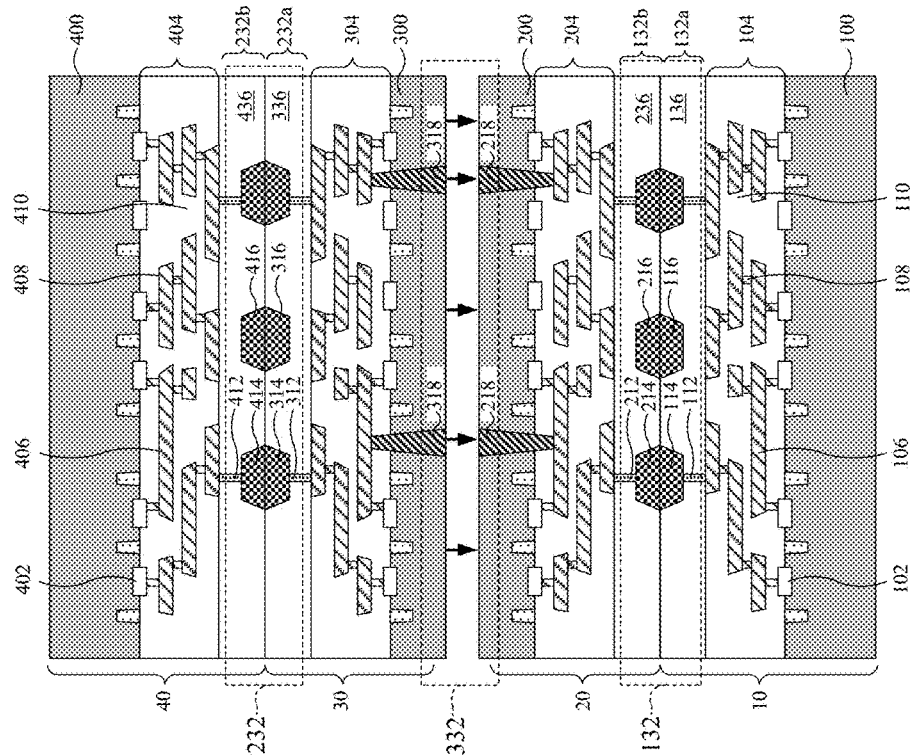
FIGS. 1-3 illustrate a series of cross-sectional views of a method for manufacturing a three-dimensional (3D) integrated circuit (IC) including a back to back bonding structure according to some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., a conductive wire) may be referred to as a "first" element in some embodiments, the element may be referred to as a "second" element in other embodiments.

A three-dimensional (3D) integrated circuit (IC) comprises a plurality of two-dimensional (2D) IC dies one stacked and bonded on another. One of the methods to manufacture the 3D IC includes bonding a first IC die and a second IC die face to face first. The first and second IC dies comprise respective semiconductor substrates, respective interconnect structures between the semiconductor substrates. The interconnect structures comprise alternating stacks of metal lines (e.g., horizontal routing) and metal vias (e.g., vertical routing). The face to face bonding means having respective bonding structures of the first IC die and the second IC die disposed between the interconnect structures. Then, a thinning process may be performed from a back side of the second IC die to thin the second substrate, and a third IC die is bonded to the second IC die. The third IC die can be bonded to the back side of the second IC die from a front side, i.e., forming a front to back bonding, and exposing a semiconductor substrate from a back side of the third IC die. The third IC die can also be bonded to the back side of the second IC die from a back side, i.e., forming a back to back bonding, and exposing an interconnect structure from a front side of the third IC die. Then, a fourth IC die can be continued to be bonded to the exposed side of the third IC die. As the technology develops and the circuitry becomes more complicated, more 2D IC dies can be stacked together. When the 3D IC includes more than three or five stacked 2D IC dies, manufacturing period becomes very long. There is a need to improve the efficiency and shorten the manufacturing period.

Figure 1:
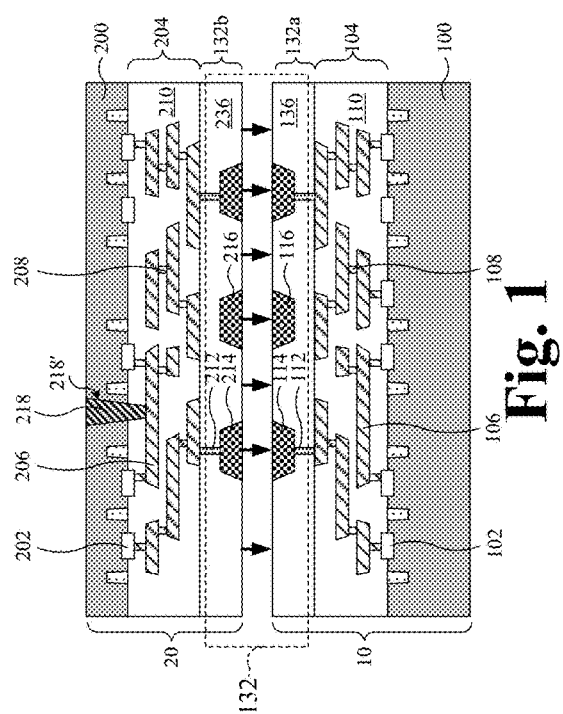
Figure 2:
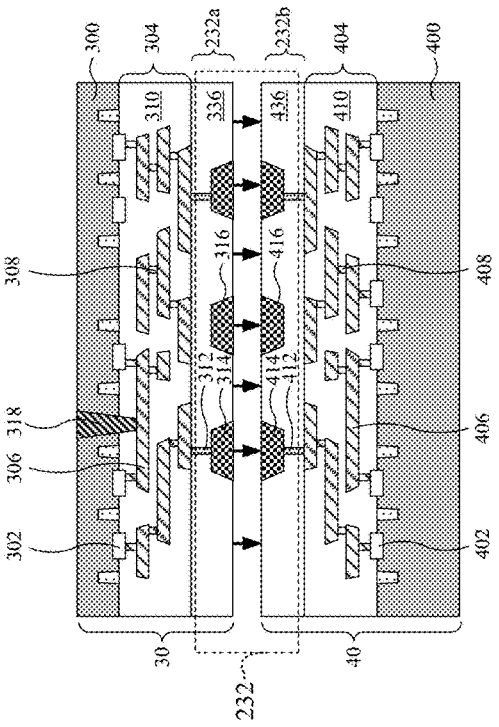

In view of the foregoing, various embodiments of the present application are directed towards a "parallel" method to manufacture a 3D IC and to improve the manufacturing period. Various embodiments of an improved hybrid bonding structure are also disclosed which can be formed in a more timely manner. Referring to FIGS. 1-3 for example, multiple dies such as four IC dies 10, 20, 30, and 40 are vertically stacked together to form a 3D IC. In some embodiments, the multiple dies can be divided in two or more sub-groups for bonding and then be bonded together. For example, a first IC die 10 and a second IC die can be bonded together, and a third IC die 30 and a fourth IC die 40 can be bonded together concurrently or at least having processing time overlapped. Then the bonded sub-groups can be bonded together. Compared to a sequential manufacturing process where the multiple dies are bonded together on after another, this "parallel" manufacturing process shortens the whole manufacturing period. Some example bonding processes and bonding structures are disclosed below.

As shown in FIG. 1, a first IC die 10 and a second IC die 20 may be bonded together face to face by a first bonding structure 132. The first IC die 10 comprises a first substrate 100 and a first interconnect structure 104 over the first substrate 100. The substrate 10, and other substrates described below, may include a semiconductor wafer, a portion of a semiconductor wafer, a semiconductor die, or other applicable substrates. The first interconnect structure 104 comprises a first plurality of metal lines 106 and a first plurality of metal vias 108 alternatingly stacked in a first ILD layer 110 (interlayer dielectric layer). The second IC die 20 comprises a second substrate 200 and a second interconnect structure 204 over the second substrate. The second interconnect structure 204 comprises a second plurality of metal lines 206 and a second plurality of metal vias 208 alternatingly stacked in a second ILD layer 210. The bonding process may be a hybrid bonding process including conductor-to-conductor bonding and dielectric-to-dielectric bonding processes. The first bonding structure 132 comprises a first portion 132a contacting the first interconnect structure 104 and a second portion 132b contacting the second interconnection structure 204. The first bonding structure 132 may comprise respective bonding dielectric layers 136, 236, respective redistribution layers 114, 214, dummy respective redistribution layers 116, 216, and respective bonding contacts 112, 212. The redistribution layers 114, 214 and the dummy respective redistribution layers 116, 216 are sunken into the bonding dielectric layers 136, 236 and directly contact each other to define a conductor-to-conductor interface. The redistribution layers 114, 214, dummy redistribution layers 116, 216, and other redistribution layers and dummy redistribution layers described below are made for bonding purposes. The redistribution layers and dummy redistribution layers may have rectangular, rounded or other applicable shapes from a top view. The redistribution layers and dummy redistribution layers may be made of Cu, Al, W, Au, Ti, Pt, Co, another suitable material, or a combination thereof. The bonding dielectric layers 136, 236, and other the bonding dielectric layers described below, may be made of silicon oxide, silicon oxynitride, silicon nitride, borosilicate glass (BSG), phosphoric silicate glass (PSG), borophosphosilicate glass (BPSG), fluorinated silicate glass (FSG), low-k material, another suitable material, or a combination thereof. The bonding dielectric layers 136, 236, and other the bonding dielectric layers described below, may be deposited using a chemical vapor deposition (CVD) process, an atomic layer deposition (ALD) process, a spin-on process, another applicable process, or a combination thereof. The bonding dielectric layers 136, 236 may be in direct contact with each other to define a dielectric-to-dielectric interface that may be aligned with a conductor-to-conductor interface. The bonding contacts 112, 212 extend respectively from the redistribution layers 114, 214 to the interconnect structures 104, 204. Then, the second substrate 200 is thinned from a back side to prepare for a subsequent bonding process. The thinning process may comprise a chemical mechanical polishing (CMP) process, and/or other thinning techniques. A second TSV (through substrate via) 218 is formed through the second substrate 200. The second TSV 218 may be formed by forming a through substrate trench opening 1602 through the second substrate 200 into the second ILD layer 210 to expose one of the metal lines 206 of the second interconnection structure 204 followed by filling a conductive material into the through substrate trench opening 1602. The second TSV 218 may have a top surface coplanar or higher than a top surface of the second substrate 200.

Similarly, as shown in FIG. 2, a third IC die 30 and a fourth IC die 40 may be bonded together face to face by a second bonding structure 232. The third IC die comprises a third substrate 300 and a third interconnect structure 304 over the third substrate. The third interconnect structure 304 comprises a third plurality of metal lines 306 and a third plurality of metal vias 308 alternatingly stacked in a third ILD layer 310. The fourth IC die 40 comprises a fourth substrate 400 and a fourth interconnect structure 404 over the fourth substrate. The fourth interconnect structure 404 comprises a fourth plurality of metal lines 406 and a fourth plurality of metal vias 408 alternatingly stacked in a fourth ILD layer 410. The second bonding structure 232 comprises a first portion 232a contacting the third interconnect structure 304 and a second portion 232b contacting the fourth interconnection structure 404. The second bonding structure 232 may also comprise respective bonding dielectric layers 336, 436, respective redistribution layers 314, 414, dummy respective redistribution layers 316, 416, and respective bonding contacts 312, 412. The redistribution layers 314, 414 and the dummy respective redistribution layers 316, 416 are sunken into the bonding dielectric layers 336, 436 and directly contact each other. The bonding contacts 312, 412 extend respectively from the redistribution layers 314, 414 to the interconnect structures 304, 404. Then, the third substrate 300 is thinned from a back side to prepare for a subsequent bonding process. A third TSV (through substrate via) 318 is formed through the third substrate 300.

As shown in FIG. 3, the second substrate 200 and the third substrate 300 are bonded together by a third bonding structure 332 through the second TSV 218 and the third TSV 318. The processes shown in FIG. 2 can be performed at the same time or in a time frame at least overlapped with performing the processes shown in FIG. 1. Then the work pieces from the processes of FIG. 1 and FIG. 2 can be bonded together. In this way, the manufacturing time period needed can be significantly reduced. The third bonding structure 332 may be different from the first bonding structure 132 or the second bonding structure 232. In some embodiments, the second TSV 218 is in direct contact with the third TSV 318, and the second substrate 200 is in direct contact with the third substrate 300. The second TSV 218 and the third TSV 318 may have sidewalls tilted in opposite directions. In a direction from top to bottom of FIG. 3, an upper part of the third TSV 318 closer to a bonding interface of the third bonding structure 332 is outwardly tilted, while an upper part of the second TSV 218 closer to a bonding interface of the third bonding structure 332 is inwardly tilted. The second TSV 218 and the third TSV 318 may have substantially same lateral dimensions.

The IC dies 10, 20, 30, 40 may respectively comprises one or more semiconductor devices 102, 202, 302, 402 distributed within the substrates 10, 20, 30, 40, and electrically coupled to one another with conductive paths defined by the interconnect structures 104, 204, 304, 404 and the bonding structures 132, 232, 332. The semiconductor devices 102, 202, 302, 402 may be, for example, MOSFETs, IGFETS, MIM capacitors, flash memory cells, or the like.

Figure 4:
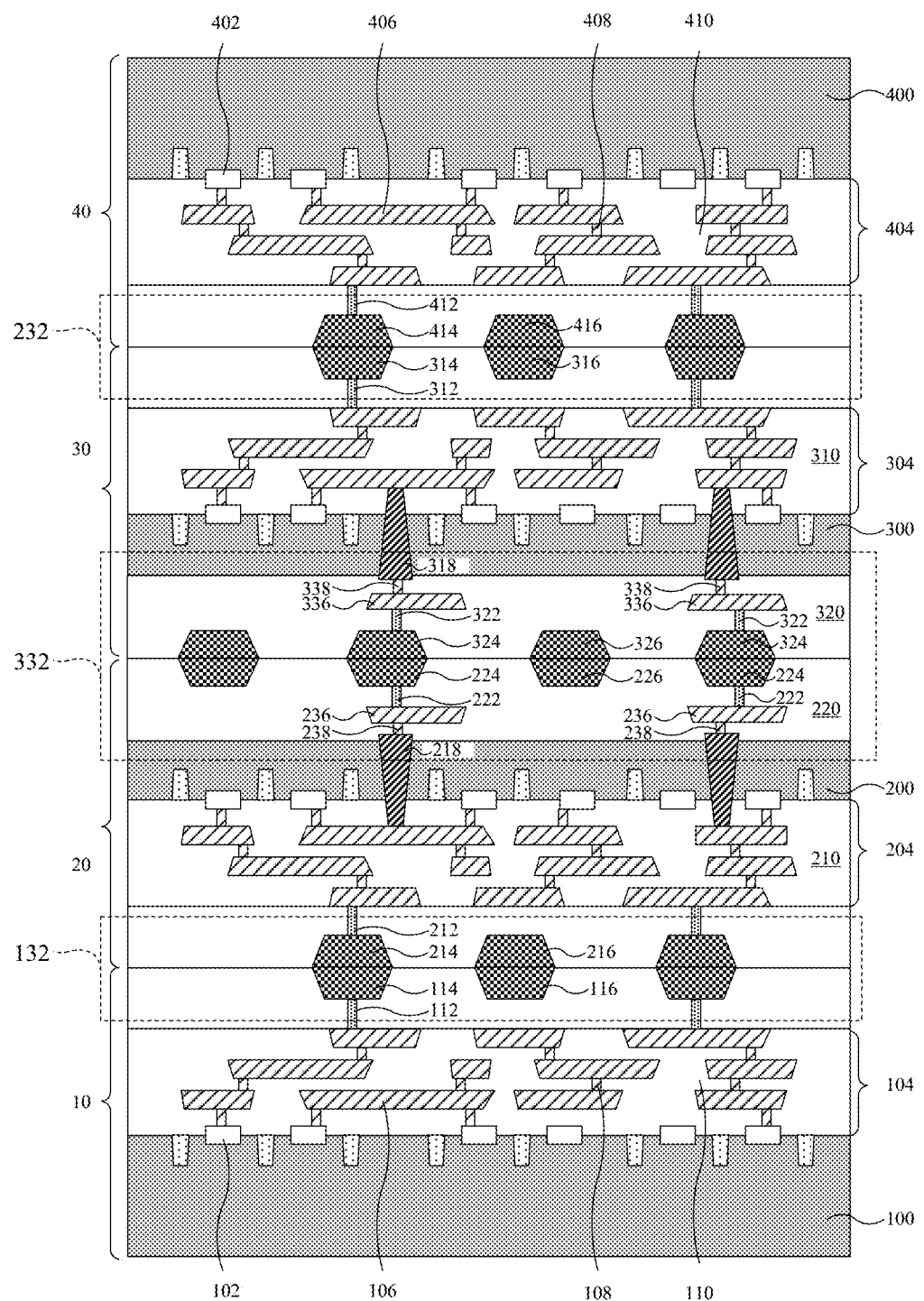
FIGS. 4 and 5 illustrate cross-sectional views of a 3D IC including a back to back bonding structure according to some alternative embodiments.

FIG. 4 shows a cross-sectional view of a 3D IC according to some additional embodiments. Disposed within bonding dielectric layers 220, 320 and between the second TSV 218 and the third TSV 318, the third bonding structure 332 may further comprise a pair of redistribution layers 224, 324 directly bonded to each other and a pair of dummy redistribution layers 226, 326 directly bonded to each other. A pair of bonding contacts 222, 322 is respectively coupled to the redistribution layers 224, 324. A second bonding metal line 236 and a second bonding metal via 238 may be disposed between the second TSV 218 and the redistribution layer 224. A third bonding metal line 336 and a third bonding metal via 338 may be disposed between the third TSV 318 and the redistribution layer 324. The bonding metal lines 236, 336 and the bonding metal vias 238, 338 provide additional routing flexibilities.

Figure 5:
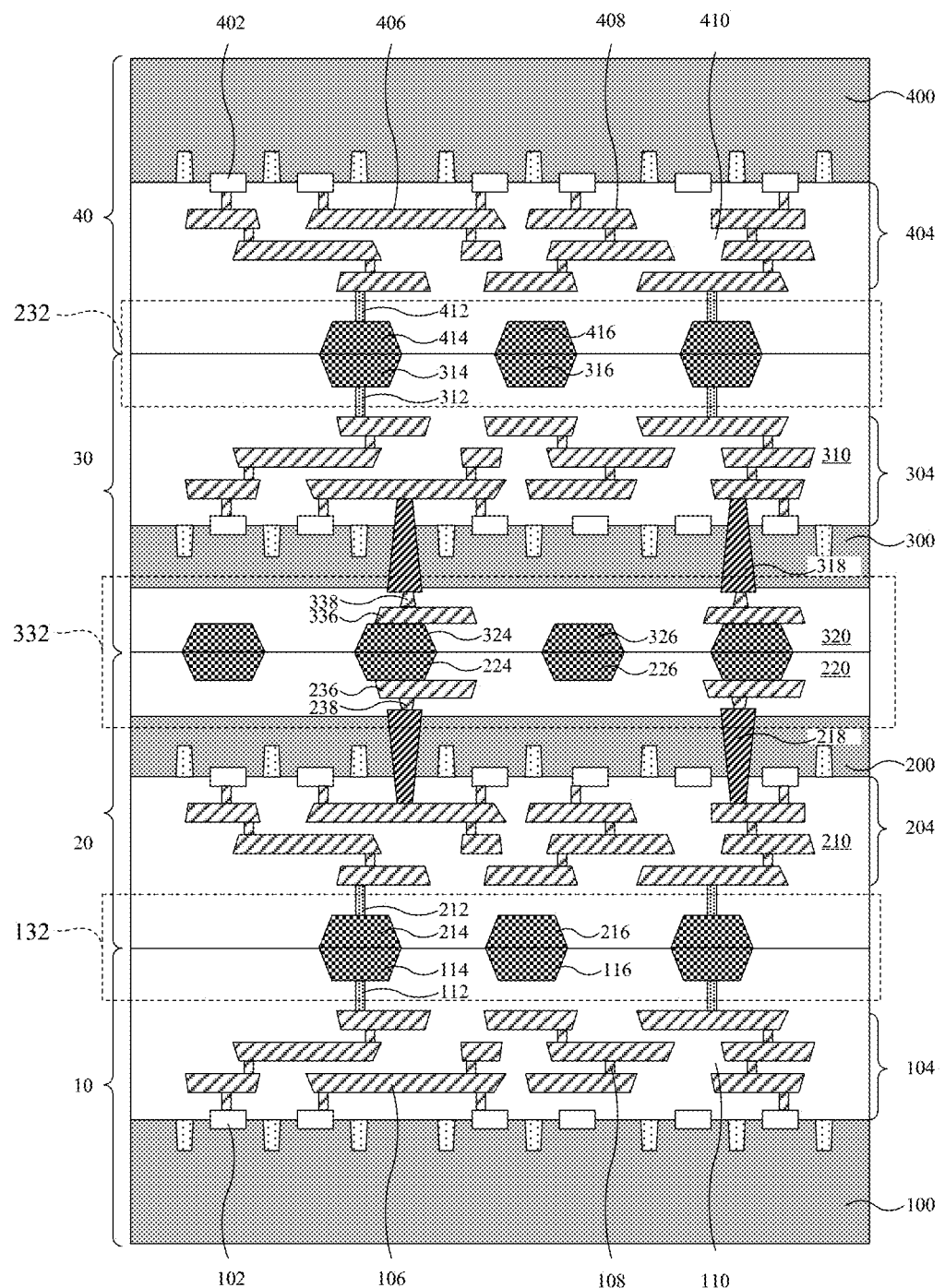

FIG. 5 shows a cross-sectional view of a 3D IC according to some additional embodiments. The pair of redistribution layers 224, 324 may be directly contact the respective second bonding metal line 236 and third bonding metal line 336. By omitting the pair of bonding contacts 222, 322 shown in FIG. 4 from the third bonding structure 332, the manufacturing process is simplified and manufacturing time is shortened.

Figure 6:
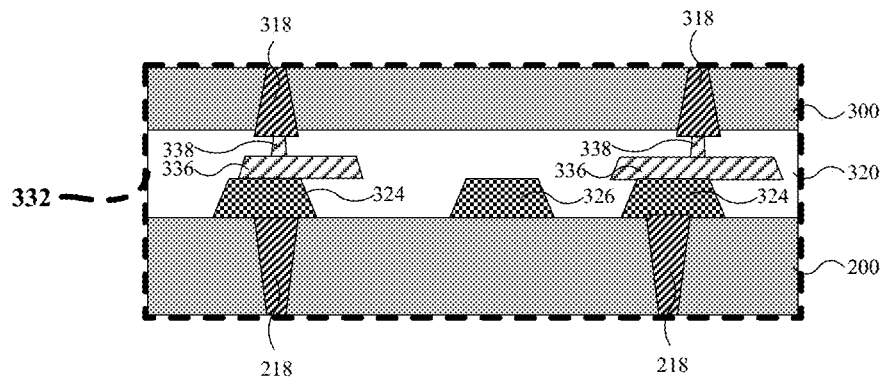
FIGS. 6-8 illustrate varies regional cross-sectional views of a 3D IC including a back to back bonding structure according to some additional embodiments.
Figure 7:
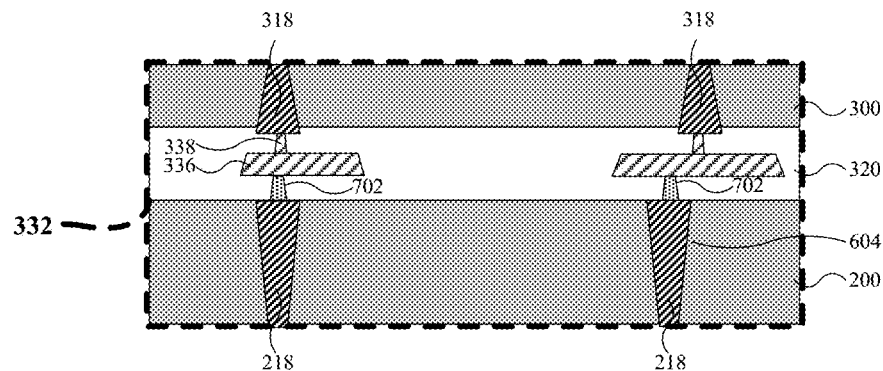
Figure 8:
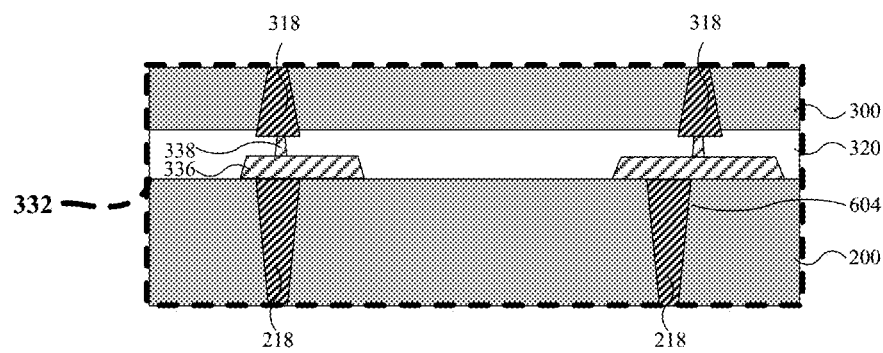

FIGS. 6-8 show varies regional cross-sectional views of a back to back bonding structure of a 3D IC. It is noted that the disclosed bonding structures are labeled as '332', and can be some additional embodiments that can incorporate into or replace the third bonding structure 332 shown in FIG. 3. The disclosed bonding structures can also stand alone or incorporate into other applicable 3D ICs. As shown in FIG. 6, a set of redistribution layer 324, bonding metal line 336, and bonding metal via 338 can be disposed within a bonding dielectric layer 320 and between the second TSV 218 and the third TSV 318. Sidewalls of the redistribution layer 324, the bonding metal line 336, and the bonding metal via 338 can be titled in the same direction (e.g. all outwardly as shown in the figure), and be same with that of the third TSV 318. As shown in FIG. 7, a set of bonding contact 702, bonding metal line 336, and bonding metal via 338 can be disposed within the bonding dielectric layer 320 and between the second TSV 218 and the third TSV 318. Sidewalls of the bonding contact 702, the bonding metal line 336, and the bonding metal via 338 can be titled in the same direction (e.g. all outwardly as shown in the figure), and be same with that of the third TSV 318. As shown in FIG. 8, a set of bonding metal line 336, and bonding metal via 338 can be disposed within the bonding dielectric layer 320 and directly contact the second TSV 218 and the third TSV 318. Sidewalls of the bonding metal line 336, and the bonding metal via 338 can be titled in the same direction (e.g. all outwardly as shown in the figure), and be same with that of the third TSV 318. The bonding metal line 336 and bonding metal via 338 provide additional routing flexibility. By omitting the bonding contacts or the redistribution layers of the previous embodiments, the manufacturing time period is further reduced.

Figure 9:
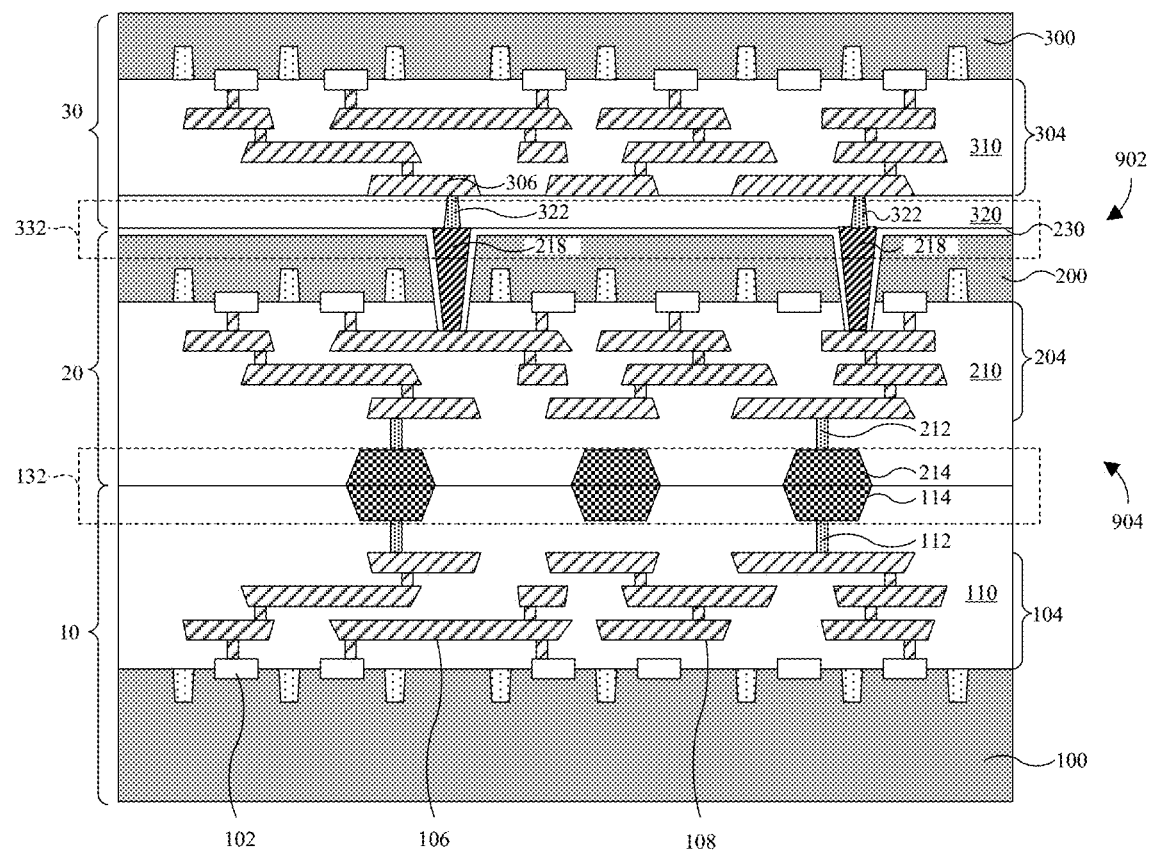
FIGS. 9-14 illustrate cross-sectional views of a 3D IC including a front to back bonding structure according to some embodiments.

FIGS. 9-14 show cross-sectional views of a 3D IC including a front to back bonding structure according to some embodiments. In FIG. 9, a first IC die 10 and a second IC die 20 may be bonded together face to face by a first bonding structure 132. The first IC die 10 comprises a first substrate 100 and a first interconnect structure 104 over the first substrate 100. The first interconnect structure 104 comprises a first plurality of metal lines 106 and a first plurality of metal vias 108 alternatingly stacked in a first ILD layer 110 (interlayer dielectric layer). The second IC die 20 comprises a second substrate 200 and a second interconnect structure 204 disposed at a front side 904 over the second substrate 200. The second interconnect structure 204 comprises a second plurality of metal lines 206 and a second plurality of metal vias 208 alternatingly stacked in a second ILD layer 210. The first bonding structure 132 comprises a first portion 132a contacting the first interconnect structure 104 and a second portion 132b contacting the second interconnection structure 204. The first bonding structure 132 may comprise respective bonding dielectric layers 136, 236, respective redistribution layers 114, 214, dummy respective redistribution layers 116, 216, and respective bonding contacts 112, 212. The redistribution layers 114, 214 and the dummy respective redistribution layers 116, 216 are sunken into the bonding dielectric layers 136, 236 and directly contact each other. The bonding contacts 112, 212 extend respectively from the redistribution layers 114, 214 to the interconnect structures 104, 204. A third IC die 30 is bonded to a back side 902 of the second IC die 20 by a third bonding structure 332. The third IC die 30 comprises a third substrate 300 and a third interconnect structure 304 over the third substrate. The third interconnect structure 304 comprises a third plurality of metal lines 306 and a third plurality of metal vias 308 alternatingly stacked in a third ILD layer 310. The third bonding structure 332 comprises a second TSV 218 disposed through the second substrate 200 and a bonding contact 322 bonded directly to the second TSV 218. The bonding contact 322 connects the second TSV 218 to one of the metal lines 306 of the third IC die 30 closest to the second IC die 20. The second TSV 218 and the bonding contact 322 may have sidewalls tilted in opposite directions. The bonding contact 322 has a lateral dimension smaller than that of the second TSV 218. The bonding contact 322 may be formed by forming a bonding dielectric layer 320 over the third IC die 30 prior to bonding the third IC die 30 to the second IC die 20. Then, a contact hole is formed through the bonding dielectric layer 320 to expose one of the metal lines 306 of the third interconnection structure 304 followed by filling a conductive material into the contact hole. Then, the third IC die 30 is flipped upside down to bond the bonding contact 322 directly to the second TSV 218 may have a top surface coplanar or higher than a top surface of the second substrate 200. A dielectric liner 230 can be formed on the second substrate 200 along the second TSV 218 and the back side 902 of the second IC 20 and bonded to the bonding dielectric layer 320.

Figure 10:
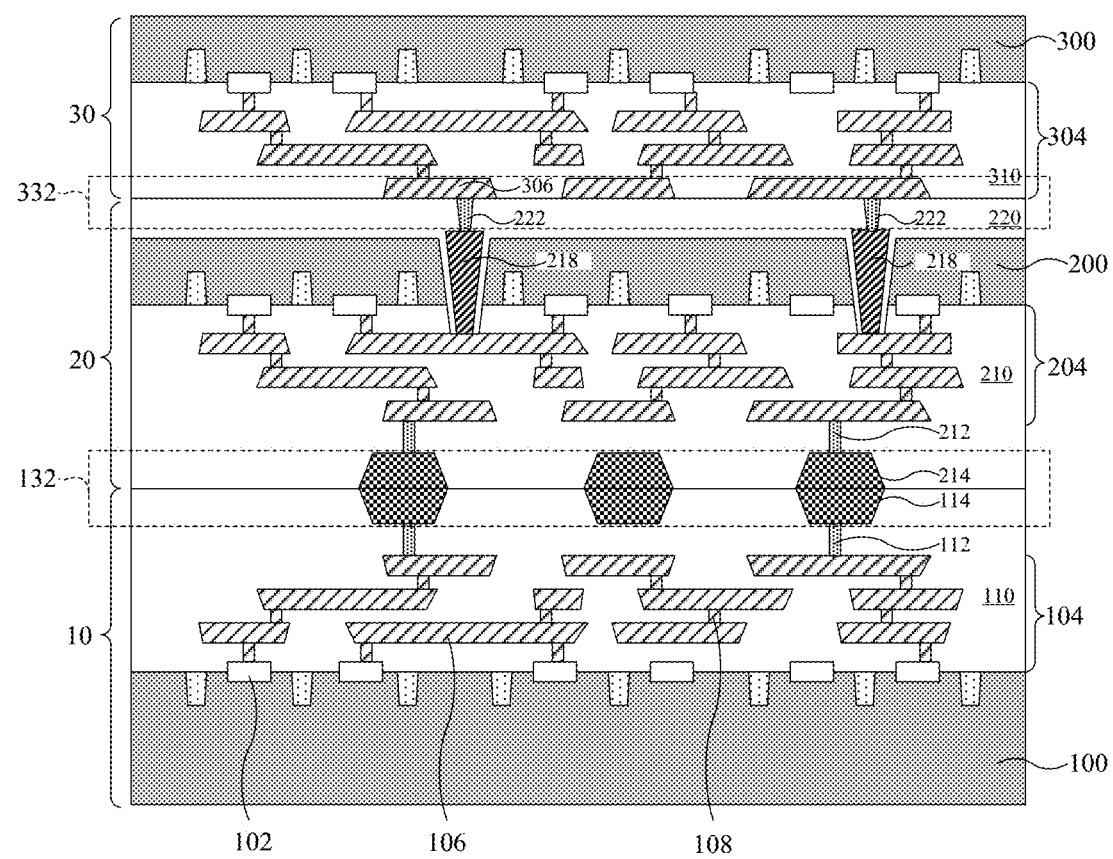

FIG. 10 shows a cross-sectional view of a 3D IC according to some additional embodiments. In FIG. 10, the second IC die 20 comprises the second TSV 218 and a bonding contact 222 disposed directly on the second TSV 218. The second TSV 218 and the bonding contact 322 may have sidewall tilted in the same direction (i.e. tilted inwardly as shown in the figure). The bonding contact 222 is bonded to one of the metal lines 306 of the third IC die 30 closest to the second IC die 20. The bonding contact 222 may be formed by forming a bonding dielectric layer 220 over the second IC die 20 prior to bonding the second IC die 20 to the third IC die 30. Then, a contact hole is formed through the bonding dielectric layer 220 to expose second TSV 218 followed by filling a conductive material into the contact hole. Then, the bonding contact 222 is bonded directly to one of the metal lines 306 of the third interconnection structure 304.

Figure 11:
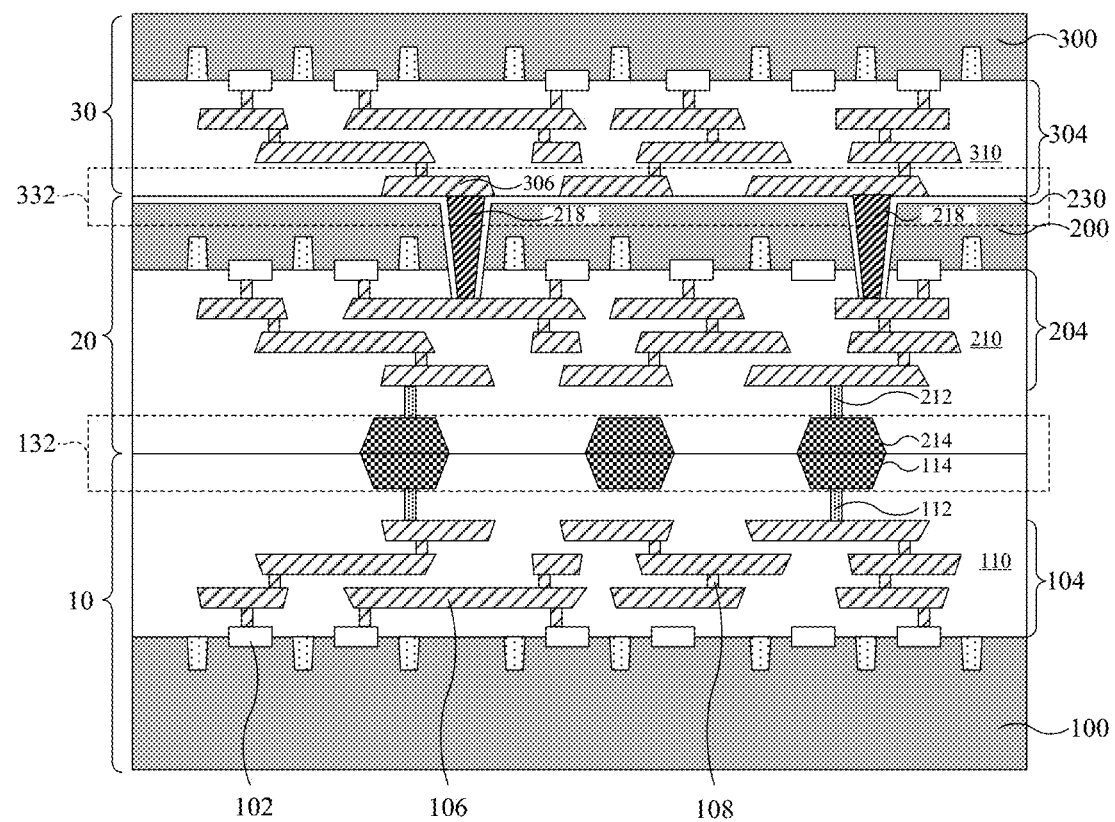

FIG. 11 shows a cross-sectional view of a 3D IC according to some additional embodiments. In FIG. 11, the second TSV 218 of the third bonding structure 332 is disposed through the second substrate 200 and bonded directly to one of the metal lines 306 of the third IC die 30 closest to the second IC die 20. The second TSV 218 and the metal lines 306 may have sidewalls tilted in opposite directions. The second TSV 218 has a lateral dimension smaller than a lateral dimension (e.g. a length) of the metal lines 306. A dielectric liner 230 can be formed on the second substrate 200 along the second TSV 218 and the back side of the second IC 20 and bonded to the third ILD layer 310. The dielectric liner 230 may be in direct contact with the metal lines 306 of the third IC die 30 closest to the second IC die 20. By omitting the bonding contacts of the previous embodiments, the manufacturing time period is further reduced.

Figure 12:
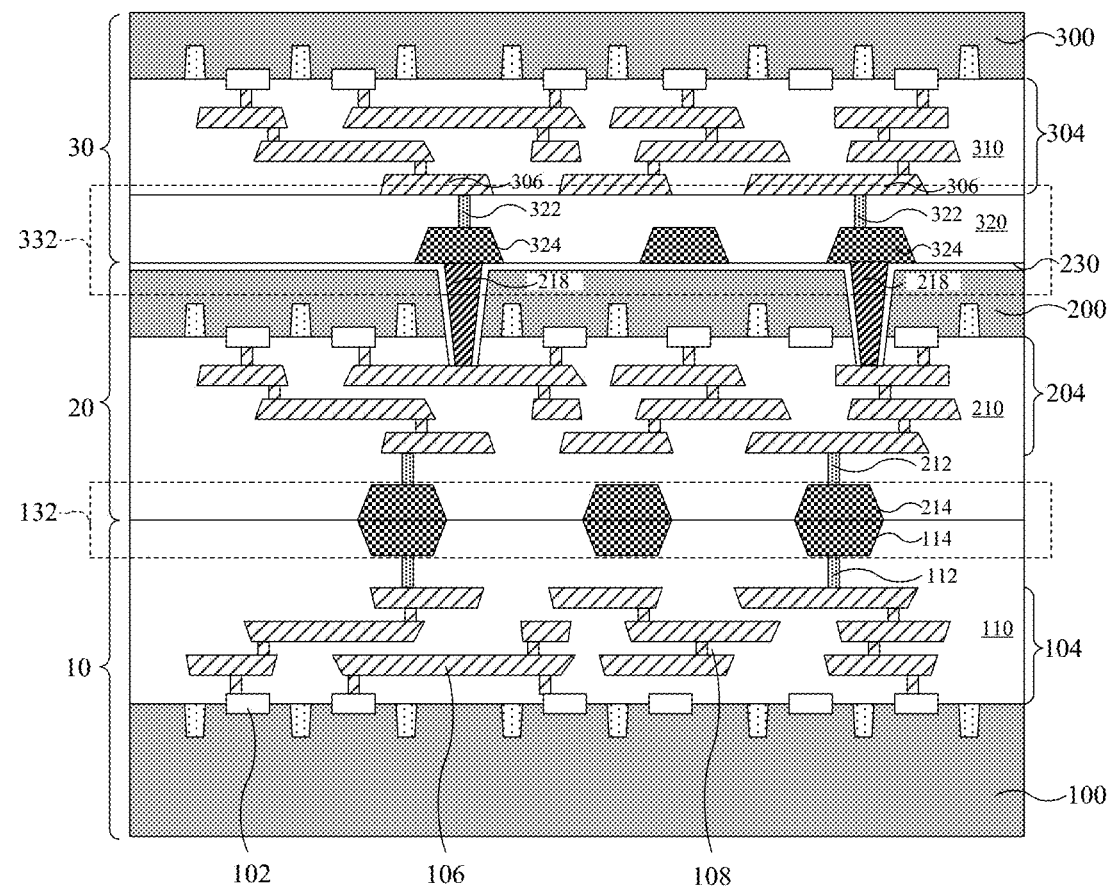

FIG. 12 shows a cross-sectional view of a 3D IC according to some additional embodiments. In FIG. 12, a bonding redistribution layer 324 and a bonding contact 322 are surrounded by a bonding dielectric layer 320, disposed on the third interconnect structure 304, and electrically coupled to one of the metal lines 306 of the third IC die 30 closest to the second IC die 20. The second TSV 218 is disposed through the second substrate 200 and bonded directly to the bonding redistribution layer 324. The second TSV 218 and the bonding redistribution layer 324 may have sidewalls tilted in opposite directions. The second TSV 218 has a lateral dimension greater than that of the bonding redistribution layer 324. A dielectric liner 230 can be formed on the second substrate 200 along the second TSV 218 and the back side of the second IC 20 and bonded to the third ILD layer 310. The dielectric liner 230 may be in direct contact with the bonding redistribution layer 324 and the bonding dielectric layer 320. By omitting forming a bonding redistribution layer and a bonding contact attached to the second substrate, the manufacturing time period is reduced. The bonding redistribution layer 324 and the bonding contact 322 may be formed by forming the bonding dielectric layer 320 over the third IC die 30 prior to bonding the third IC die 30 to the second IC die 20. Then, a contact hole is formed through the bonding dielectric layer 320 to expose one of the metal lines 306 of the third interconnection structure 304, and a trench opening is formed within an upper portion of the bonding dielectric layer overlying the contact hole. A conductive material is filled in the contact hole and the trench opening. Then, the third IC die 30 is flipped upside down to bond the redistribution layer 324 directly to the second TSV 218. Prior to the bonding process, the dielectric liner 230 can be formed on the second substrate 200 along the second TSV 218 and the back side of the second IC 20, which can be adhered to the bonding dielectric layer 320 during the bonding process.

Figure 13:
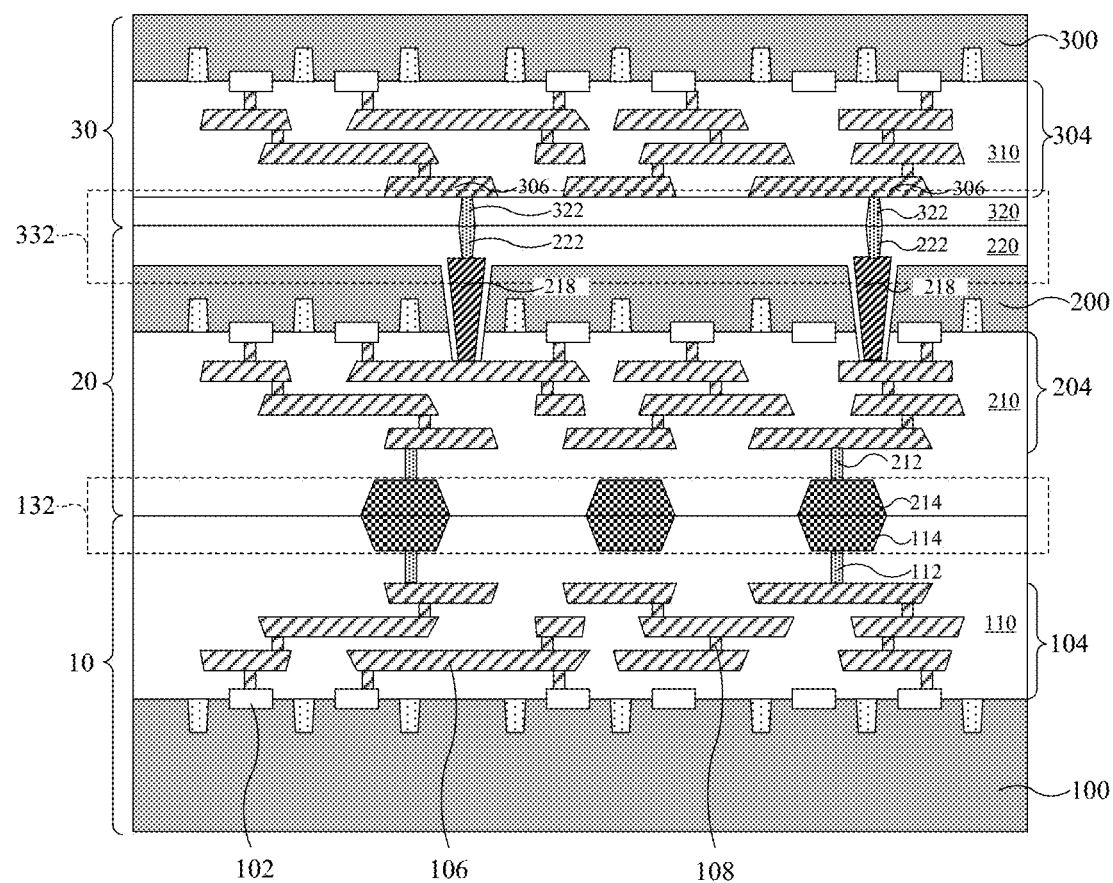

FIG. 13 shows a cross-sectional view of a 3D IC according to some additional embodiments. In FIG. 13, the second TSV 218 of the second IC die 20 and the metal lines 306 of the third IC die 30 are electrically coupled through a second bonding contact 222 surrounded by a second bonding dielectric layer 220 and a third bonding contact 322 surrounded by a second bonding dielectric layer 320. The second bonding contact 222 and the third bonding contact 322 may be bonded together and may have sidewalls tilted in opposite directions. The second bonding dielectric layer 220 can be adhered to the third bonding dielectric layer 320 during the bonding process.

Figure 14:
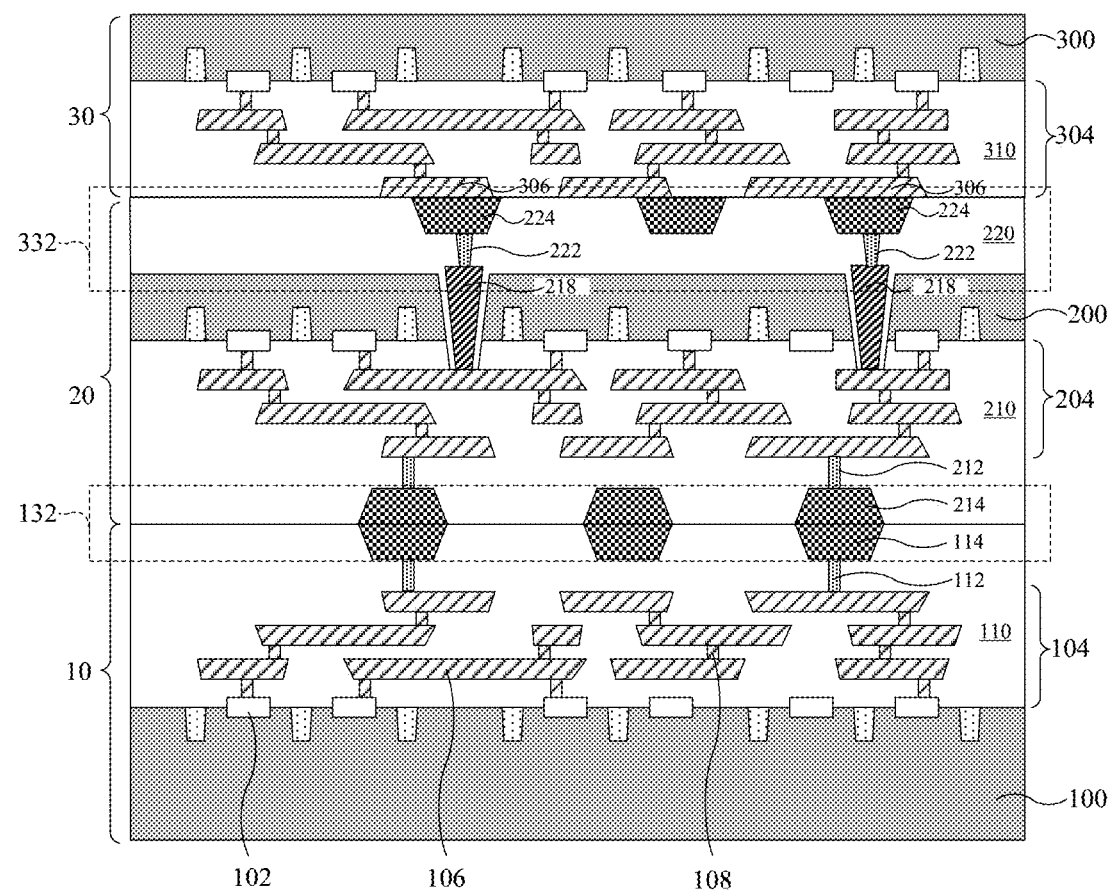

FIG. 14 shows a cross-sectional view of a 3D IC according to some additional embodiments. In FIG. 14, a bonding redistribution layer 224 and a bonding contact 222 are surrounded by a bonding dielectric layer 220, disposed on the second substrate 200, and electrically coupled to the second TSV 218. The bonding redistribution layer 224 is bonded directly to one of the metal lines 306 of the third IC die 30 closest to the second IC die 20. The metal line 306 and the bonding redistribution layer 224 may have sidewalls tilted in opposite directions. The bonding redistribution layer 224 and the bonding contact 222 may be formed by forming the bonding dielectric layer 220 over the second IC die 20 prior to bonding the third IC die 30 to the second IC die 20. Then, a contact hole is formed through the bonding dielectric layer 220 to expose the second TSV 218, and a trench opening is formed within an upper portion of the bonding dielectric layer 220 overlying the contact hole. A conductive material is filled in the contact hole and the trench opening to form the bonding contact 222 and the bonding redistribution layer 224. Then, the third IC die 30 is bonded to the redistribution layer 224. The third ILD layer 310 can be adhered to the bonding dielectric layer 220 during the bonding process.

With reference to FIGS. 15-19, a series of cross-sectional views 1500-1900 illustrate some embodiments of a method for manufacturing a 3D IC having a plurality of 2D IC vertically stacked together.

Figure 15:
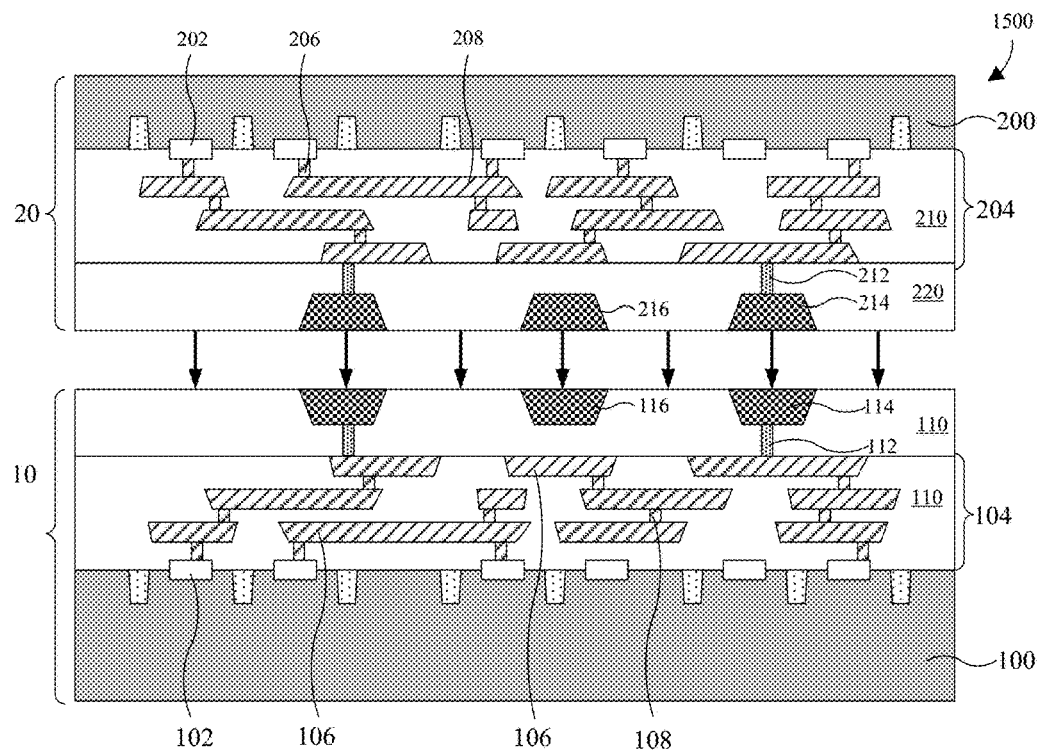
FIGS. 15-19 illustrate a series of cross-sectional views of a method for manufacturing a three-dimensional (3D) integrated circuit (IC) including a front to back bonding structure according to some embodiments.

As illustrated by the cross-sectional view 1500 of FIG. 15, a first IC die 10 and a second IC die 20 are formed and bonded together. Various device elements 102 are formed in the first substrate 100. Examples of the device elements 102 include transistors, diodes, memory devices or other suitable elements. Various processes may be used to form the device elements 102 including deposition, etching, implantation, photolithography, annealing, and/or other suitable processes. A first interconnection structure 104 is formed on the first substrate 100 overlying the device elements 102. The first interconnection structure 104 includes a first plurality of metal lines 106 and a first plurality of metal vias 108 alternatingly stacked in a first ILD layer 110 (interlayer dielectric layer). The first ILD layer 110 may include multiple dielectric sub-layers. The formation of the first interconnection structure 104 may involve multiple deposition, patterning, and planarization processes. The planarization processes may include chemical mechanical polishing (CMP) processes. In some embodiments, a planarization process is performed such that the top surfaces of some of the metal lines 106 are exposed and substantially coplanar with the top surface of the first ILD layer 110. A first bonding dielectric layer 120 is formed on the first interconnection structure 104, and a first bonding contact 112, a first redistribution layer 114, and a first dummy redistribution layer 116 can be formed sunken into the first bonding dielectric layer 136. For simplicity reason, it is not repeated here, but a second IC die 20 can be formed in a similar manner as forming the first IC die 10. The second IC die 20 comprises a second substrate 200 and a second interconnect structure 204 over the second substrate. The second interconnect structure 204 comprises a second plurality of metal lines 206 and a second plurality of metal vias 208 alternatingly stacked in a second ILD layer 210. A second bonding contact 212, a second redistribution layer 214, and a second dummy redistribution layer 216 can be formed sunken into a first bonding dielectric layer 136 and overlying the second interconnection structure 204. The bonding process may be a hybrid bonding process including conductor-to-conductor bonding of the redistribution layers 114, 214 and the dummy redistribution layers 116, 216 and dielectric-to-dielectric bonding of the bonding dielectric layers 136, 236.

Figure 16:
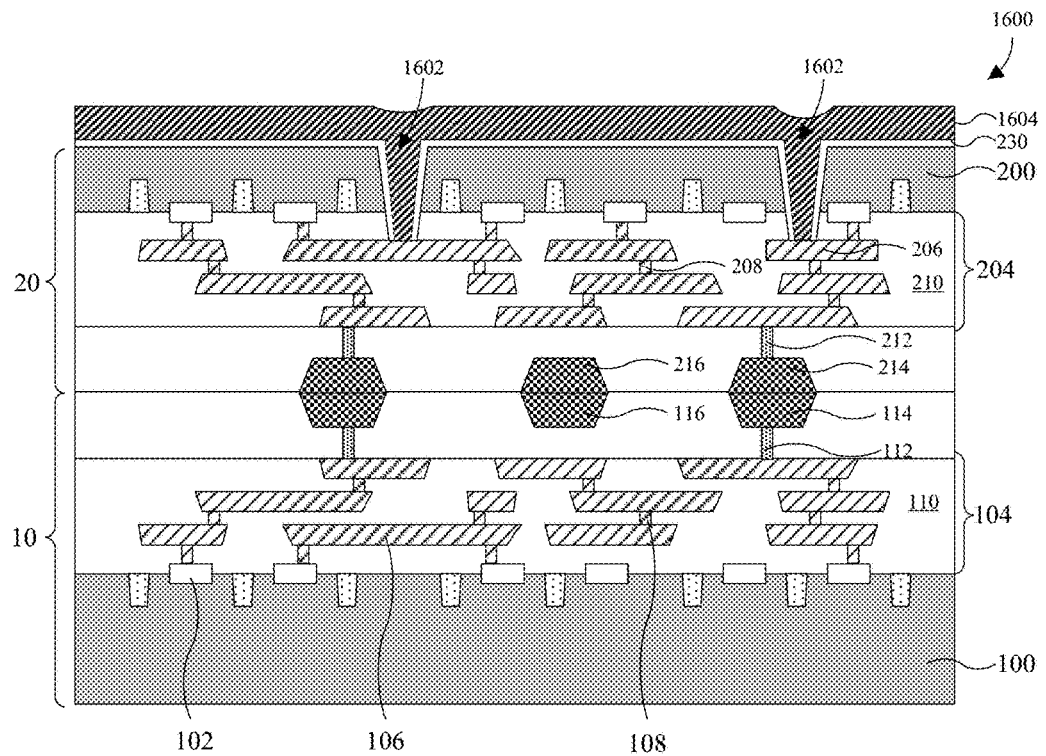
Figure 17:
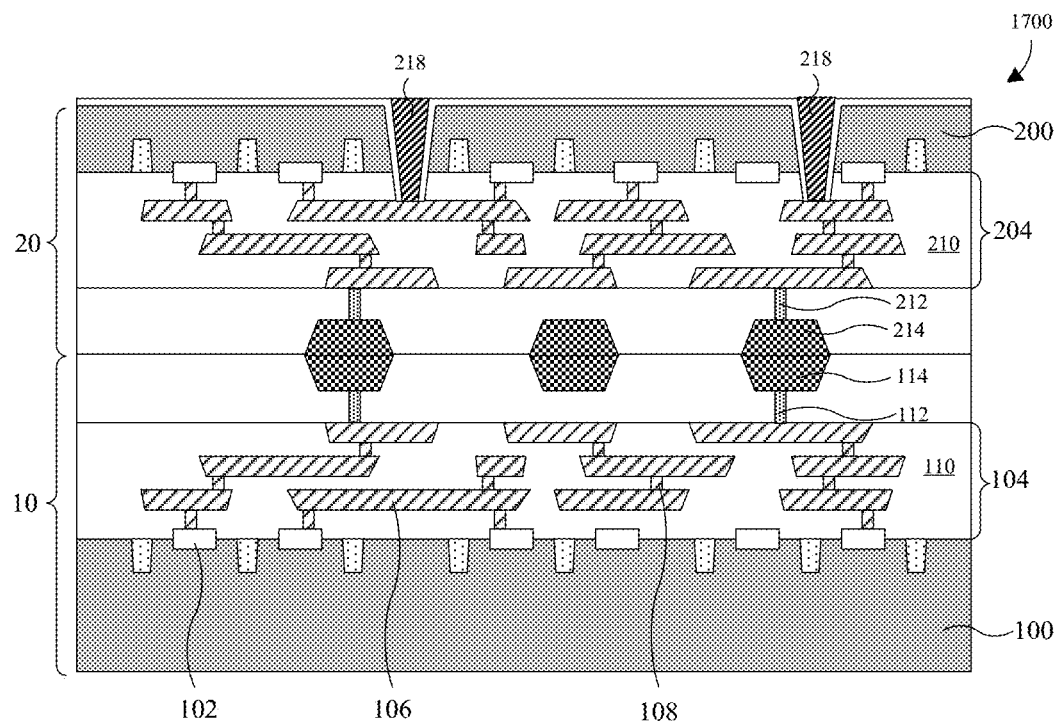

As illustrated by the cross-sectional view 1600 of FIG. 16 and the cross-sectional view 1700 of FIG. 17, a second TSV (through substrate via) 218 is formed through the second substrate 200. In FIG. 16, the second substrate 200 is firstly thinned from a back side. The thinning process may comprise a chemical mechanical polishing (CMP) process, and/or other thinning techniques. A through substrate trench opening 1602 is formed through the second substrate 200 into the second ILD layer 210 to expose one of the metal lines 206 of the second interconnection structure 204 followed by filling a conductive material into the through substrate trench opening. In some embodiments, a photolithography process and an etching process are used to form the through substrate trench opening 1602. In some embodiments, the sidewalls of the through substrate trench opening 1602 are substantially perpendicular to the top surface of the substrate 200. In some other embodiments, the through substrate trench opening 1602 has slanted or tilted sidewalls. In some embodiments, the trench gradually becomes narrower as the etching process goes deeper, i.e., the trench is inwardly tilted. It is appreciated that other connection structures may have same tilting features for better filling. For example, from a front side of the second IC die 20, the metal lines 206, the metal vias 208, the redistribution layers 214, the dummy redistribution layers 216, and the bonding contacts 212 respectively become narrower from an upper side away from the second substrate 200 to a lower side closer to the second substrate 200, i.e., outwardly titled as shown in FIG. 16 (meaning the feature becomes wider from upper to lower direction of the FIG. 16). From a front side of the first IC die 10, the metal lines 106, the metal vias 108, the redistribution layers 114, the dummy redistribution layers 116, and the bonding contacts 112 respectively become narrower from an upper side away from the second substrate 100 to a lower side closer to the second substrate 100, i.e., inwardly titled as shown in FIG. 16 (meaning the feature becomes narrower from upper to lower direction of the FIG. 16). A dielectric liner 230 can be formed on the back side of the second IC die 20 and along the through substrate trench opening 1602 between the conductive material and the second substrate 200. The conductive material may be formed of, for example, aluminum, copper, aluminum copper, some other conductive material, a combination of the foregoing, or the like. The conductive material may, for example, be formed by vapor deposition, atomic layer deposition, electrochemical planting, some other growth or deposition process, or a combination of the foregoing. In FIG. 17, an excessive portion of the conductive material is etched back and removed to form the second TSV 218. The second TSV 218 may have a top surface coplanar with that of the dielectric liner 230. The second TSV 218 may also have an upper or top surface aligned with an upper or top surface of the second substrate 200 if the dielectric liner 230 is not presented or is removed from the back side of the second substrate 200. The etch back process may include a planarization process, for example, a CMP process.

Figure 18:
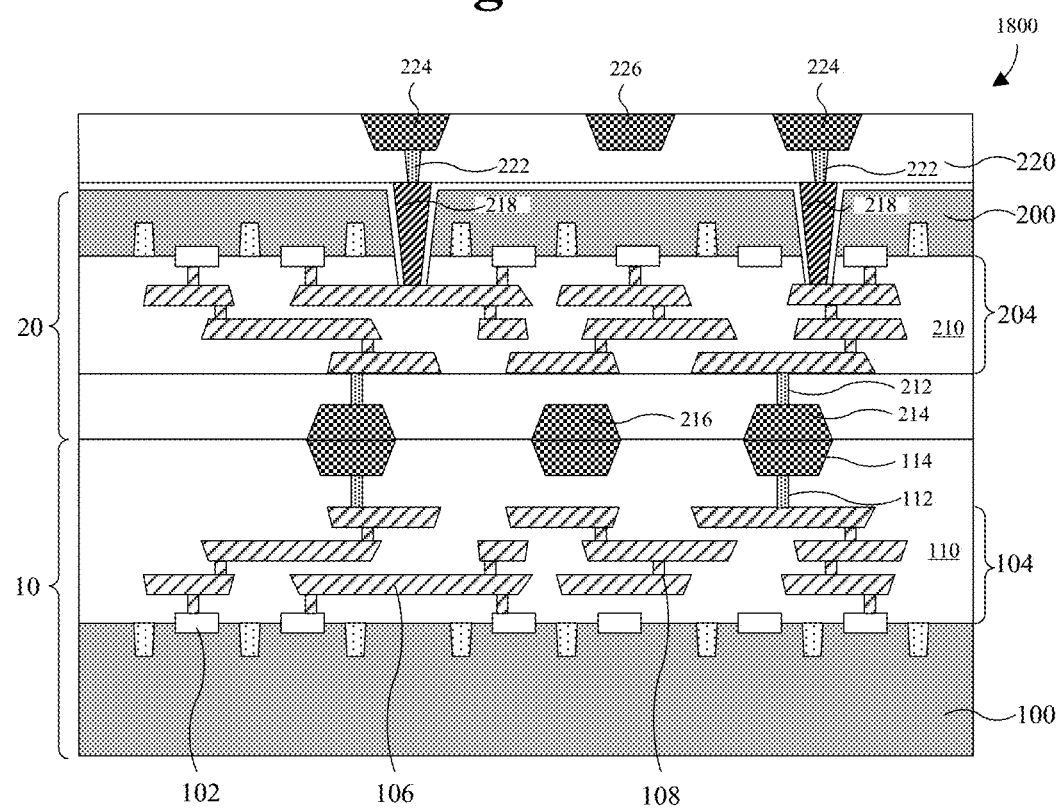

As illustrated by the cross-sectional view 1800 of FIG. 18, a redistribution layer 224, a dummy redistribution layer 226, and a bonding contact 222 are formed within a second bonding dielectric layer 220. Still using the definition described in FIG. 16, from a back side of the second IC die 20, the redistribution layers 224, the dummy redistribution layers 226, and the bonding contacts 222 respectively become narrower from an upper side away from the second substrate 200 to a lower side closer to the second substrate 200, i.e., inwardly titled as shown in FIG. 18 (meaning the feature becomes narrower from upper to lower direction of the FIG. 18). The bonding redistribution layer 224 and the dummy redistribution layer 226, and the bonding contact 322 may be formed by forming a plurality of contact holes through the bonding dielectric layer 320 to reach on the second TSV 218. Then, a plurality of trench openings are formed within an upper portion of the second bonding dielectric layer 220. Some of the trench openings overly the contact hole. A conductive material is filled in the contact hole and the trench opening followed by a planarization process. It is appreciated that though a via-first dual-damascene like process is described above to form the redistribution layer 224 and the bonding contact 222, other processes such as trench-first dual damascene process or single damascene process can also be used.

Figure 19:
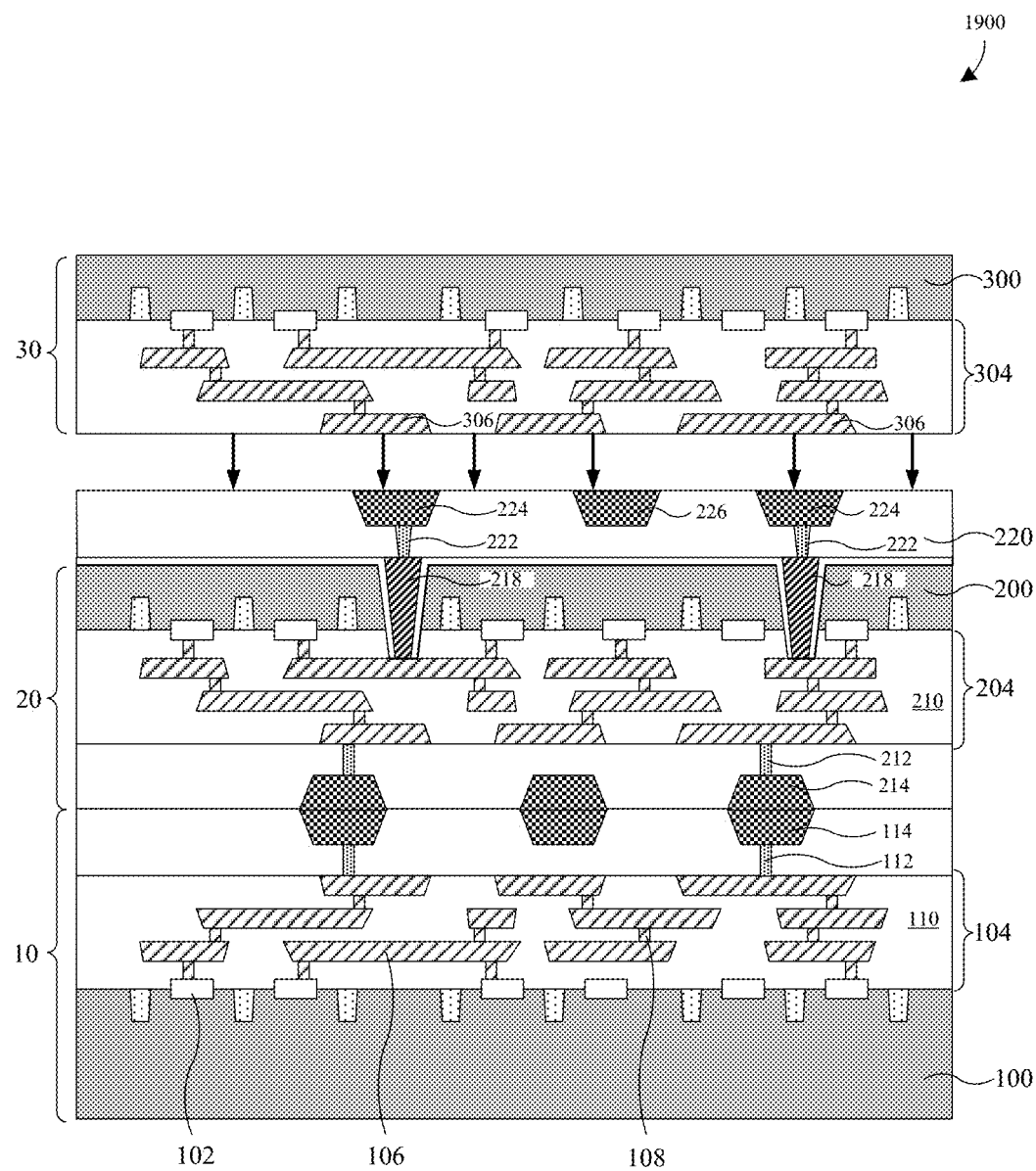

As illustrated by the cross-sectional view 1900 of FIG. 19, a third IC die 30 is bonded to the back side of the second IC die 20. The third IC die 30 may comprise a third substrate 300 and a third interconnect structure 304 over the third substrate 300. The third interconnect structure 304 comprises a third plurality of metal lines 306 and a third plurality of metal vias 308 alternatingly stacked in a third ILD layer 310. The bonding redistribution layer 224 and the dummy redistribution layer 226 are bonded to metal lines 306 of the third IC die 30 closest to the second IC die 20. A bonding interface of third IC die 30 and the second IC die 20 can be detected by the tilting directions of the features' sidewalls. Still using the definition described in FIG. 16, from a front side of the third IC die 30, the metal lines 306 and the metal vias 308 are outwardly titled as shown in FIG. 19 (meaning the feature becomes wider from upper to lower direction of the FIG. 19). Thus, sidewalls of the metal lines 306 and the metal vias 308 are tilted in a direction (outward) opposite to the tilting direction (inward) of the bonding redistribution layer 224 and the dummy redistribution layer 226. Though not shown in the figures, barrier liners may be formed along respective sidewall and bottom surfaces of the metal lines 306, the redistribution layers 224 and the dummy redistribution layers 226, but not along the bonding interface where the metal lines 306 are bonded to the redistribution layers 224 or the dummy redistribution layers 226.

It is noted that FIGS. 15-19 illustrate some example manufacturing processes to form some embodiments of a 3D IC having a structure corresponding to FIG. 14. It is appreciated that the processes shown in FIGS. 15-19 can be altered to form some other embodiments of a 3D IC as shown in other figures. For example, the third IC die 30 may be flipped upside down to be back-side bonded to the second IC die 20 to form structures shown in FIGS. 4-8; the bonding dielectric layer 320 and the bonding contact 322 can be formed on the third interconnect structure 310 prior to bonding the third IC die 30 to the second IC die 20 to prepare for the structure shown in FIG. 9; the redistribution layer 224 can be omitted from forming on the second interconnect structure 210 to prepare the second IC die 20 for the structure shown in FIG. 10, the bonding contact 222 can be further omitted from forming on the second interconnect structure 210 to prepare the second IC die 20 for the structure shown in FIG. 11, and so on. It is appreciated the components formed between two IC dies help to provide better (e.g. flatter) bonding interface, and additional metal lines helps to provide more flexible routing. However, extra layers of bonding components are process time consuming. As the planarization process improves, those layers can be reduced or omitted, which would reduce process period time.

Figure 20:
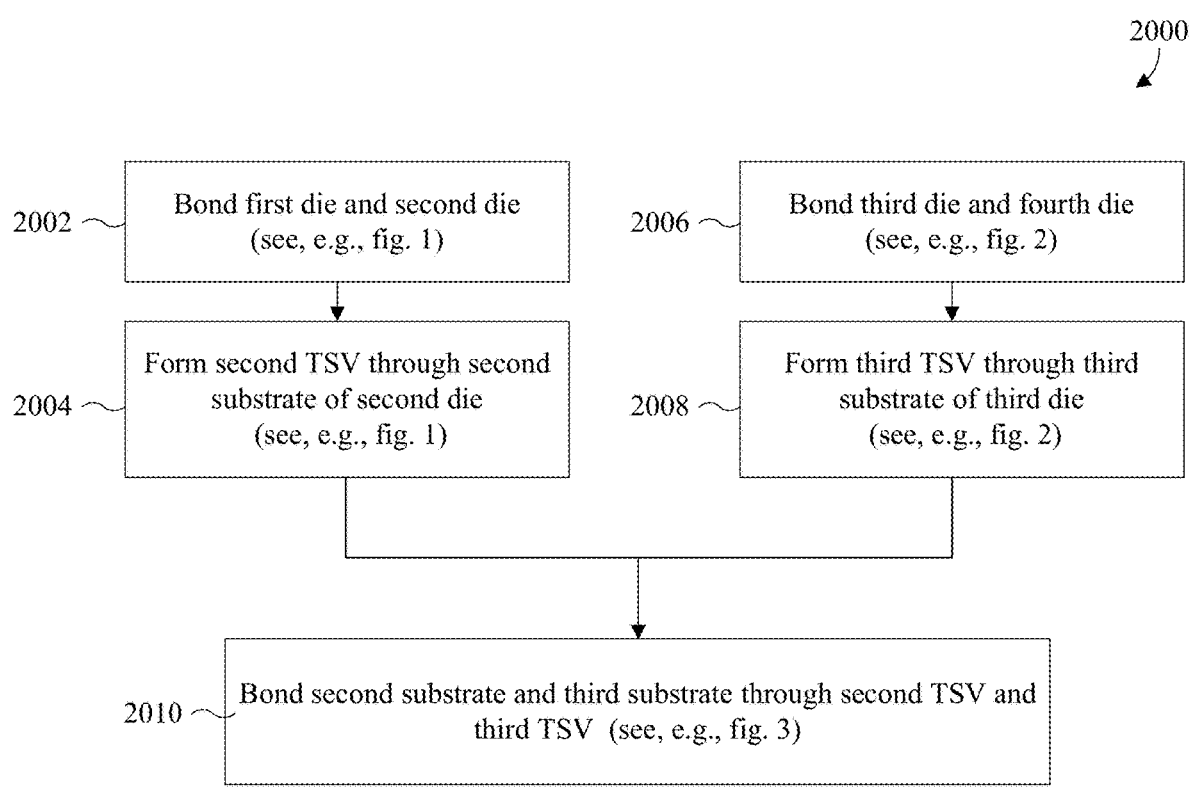
FIG. 20 illustrates a flow diagram of a method of forming an integrated circuit device according to some embodiments.

FIG. 20 shows some embodiments of a flow diagram of a method 2000 of forming an integrated circuit device. Although method 2000 is described in relation to FIGS. 1-3, it will be appreciated that the method 2000 is not limited to such structures disclosed in FIGS. 1-3, but instead may stand alone independent of the structures disclosed in FIGS. 1-3. Similarly, it will be appreciated that the structures disclosed in FIGS. 1-3 are not limited to the method 2000, but instead may stand alone as structures independent of the method 2000. Also, while disclosed methods (e.g., method 2000) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2002, a first IC die and a second IC die are provided and bonded. The first IC die comprises a first substrate and a first interconnect structure over the first substrate. The second IC die comprises a second substrate and a second interconnect structure over the second substrate. The second IC die is bonded to the first IC die by a first bonding structure comprising a first portion contacting the first interconnect structure and a second portion contacting the second interconnection structure.

At 2004, the second substrate is thinned. A second TSV is formed through the second substrate. For example, FIG. 1 shows some embodiments of a cross-sectional view 100 corresponding to act 2002 and act 2004.

At 2006, a third IC die and a fourth IC die are provided and bonded. The third IC die comprises a third substrate and a third interconnect structure over the third substrate. The fourth IC die comprises a fourth substrate and a fourth interconnect structure over the fourth substrate. The fourth IC die is bonded to the third IC die by a second bonding structure comprising a first portion contacting the third interconnect structure and a second portion contacting the fourth interconnection structure.

At 2008, the third substrate is thinned. A third TSV is formed through the third substrate. For example, FIG. 2 shows some embodiments of a cross-sectional view 200 corresponding to act 2006 and act 2008.

At 2010, the second substrate and the third substrate are bonded through the second TSV and the third TSV. For example, FIG. 3 shows some embodiments of a cross-sectional view 300 corresponding to act 2010.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

In view of the foregoing, some embodiments of the present application provide a 3D IC. A first IC die comprises a first interconnect structure over a first substrate. A second IC die is bonded to the first IC die by a first bonding structure and comprises a second interconnect structure over a second substrate. The first bonding structure comprising a first portion contacting the first interconnect structure and a second portion contacting the second interconnection structure. The first portion and the second portion are hybrid bonded together. A third IC die comprises a third substrate and a third interconnect structure over the third substrate. The third IC die is bonded to the second IC die by a third bonding structure. The third bonding structure is arranged between back sides of the second IC die and the third IC die opposite to corresponding interconnection structures and comprises a second TSV (through substrate via) disposed through the second substrate and a third TSV disposed through the third substrate.

Further, other embodiments of the present application provide another 3D IC. The 3D IC comprises a first IC die and a second IC die having a front side and a back side opposite to the front side. The first IC die is bonded to the front side of the second IC die by a first bonding structure. A third IC die is bonded to the back side of the second IC die by a third bonding structure. The third bonding structure comprises a second TSV (through substrate via) disposed through the second substrate and directly bonded to a conductive feature that has a sidewall tilted in an opposite direction to a sidewall of the second TSV Further yet, other embodiments of the present application provide a method for manufacturing a 3D IC. A first IC die and a second IC die are bonded. The first IC die comprises a first substrate and a first interconnect structure over the first substrate. The second IC die comprises a second substrate and a second interconnect structure over the second substrate. The second IC die is bonded to the first IC die by a first bonding structure comprising a first portion contacting the first interconnect structure and a second portion contacting the second interconnection structure. A third IC die and a fourth IC die are bonded. The third IC die comprises a third substrate and a third interconnect structure over the third substrate, and the fourth IC die comprises a fourth substrate and a fourth interconnect structure over the fourth substrate. The fourth IC die is bonded to the third IC die by a second bonding structure comprising a first portion contacting the third interconnect structure and a second portion contacting the fourth interconnection structure. The second substrate and the third substrate are respectively thinned, and a second TSV and a third TSV are respectively formed through the second substrate and the third substrate. The second substrate and the third substrate are bonded through the second TSV and the third TSV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional (3D) integrated circuit (IC) comprising:

a first IC die comprising a first substrate and a first interconnect structure over the first substrate;

a second IC die comprising a second substrate and a second interconnect structure over the second substrate, wherein the second IC die is bonded to the first IC die by a first bonding structure comprising a first portion contacting the first interconnect structure and a second portion contacting the second interconnection structure, wherein the first portion and the second portion are hybrid bonded together; and a third IC die comprising a third substrate and a third interconnect structure over the third substrate, wherein the third IC die is bonded to the second IC die by a third second bonding structure, wherein the second bonding structure is arranged between back sides of the second IC die and the third IC die opposite to corresponding interconnection structures and comprises a first TSV (through substrate via) disposed through the second substrate and a second TSV disposed through the third substrate;

wherein the first TSV or the second TSV directly contacts a conductive feature with an oppositely titled sidewall.

2. The 3D IC according to claim 1,
wherein the first TSV is in direct contact with the second TSV, and the second substrate is in direct contact with the third substrate.

3. The 3D IC according to claim 1,
wherein the second bonding structure further comprises a bonding metal line and a bonding metal via disposed between the first TSV and the second TSV.

4. The 3D IC according to claim 3,
wherein the second bonding structure further comprises a redistribution layer disposed between the first TSV and the second TSV.

5. The 3D IC according to claim 4,
wherein the bonding metal line is in direct contact with the redistribution layer.

6. The 3D IC according to claim 3,
wherein the second bonding structure is different from the first bonding structure.

7. The 3D IC according to claim 1,
wherein the first interconnect structure comprises a first plurality of metal lines and a first plurality of metal vias alternatingly stacked in a first ILD layer (interlayer dielectric layer);
wherein the second interconnect structure comprises a second plurality of metal lines and a second plurality of metal vias alternatingly stacked in a second layer; and
wherein the third interconnect structure comprises a third plurality of metal lines and a third plurality of metal vias alternatingly stacked in a third ILD layer.

8. The 3D IC according to claim 7,
wherein the first TSV overlies the second interconnect structure reaching on one of the second plurality of metal lines closest to the second substrate; and
wherein the second TSV overlies the third interconnect structure reaching on one of the third plurality of metal lines closest to the third substrate.

9. The 3D IC according to claim 1,
wherein the first portion of the first bonding structure comprises a first bonding dielectric layer, a first redistribution layer and a first bonding contact extending from the first redistribution layer to the first interconnect structure;
wherein the second portion of the first bonding structure comprises a second bonding dielectric layer, a second redistribution layer and a second bonding contact extending from the second redistribution layer to the second interconnect structure;
wherein the first and second bonding dielectric layers are in direct contact to define a dielectric-to-dielectric interface, wherein the first and second redistribution layers are in direct contact to define a conductor-to-conductor interface alighted with the dielectric-to-dielectric interface.

10. The 3D IC according to claim 1, further comprising:
a fourth IC die comprising a fourth substrate and a fourth interconnect structure over the fourth substrate, wherein the fourth IC die is bonded to the third IC die by a third bonding structure comprising a first portion contacting the third interconnect structure and a second portion contacting the fourth interconnection structure, wherein the first portion and the second portion are hybrid bonded together.

11. A three-dimensional (3D) integrated circuit (IC) comprising:
a first IC die;
a second IC die comprising a second substrate and a second interconnect structure over the second substrate, the second IC die having a front side and a back side opposite to the front side, wherein the first IC die is bonded to the front side of the second IC die by a first bonding structure; and
a third IC die comprising a third substrate and a third interconnect structure over the third substrate, wherein the third IC die is bonded to the back side of the second IC die by a third bonding structure, wherein the third bonding structure comprises a first TSV (through substrate via) disposed through the second substrate and directly bonded to a conductive feature of the third IC die that has a sidewall tilted in an opposite direction to a sidewall of the first TSV.

12. The 3D IC according to claim 11, wherein the back side of the second IC die is bonded to a front side of the third IC die.

13. The 3D IC according to claim 12, wherein the first TSV is bonded to the front side of the third IC die by a bonding contact has a lateral dimension smaller than the first TSV.

14. The 3D IC according to claim 12, wherein the first TSV is bonded to the front side of the third IC die by a bonding metal line has a lateral dimension greater than that of the first TSV.

15. The 3D IC according to claim 12, wherein the first TSV is bonded to the front side of the third IC die by a bonding redistribution layer has a lateral dimension greater than that of the first TSV.

16. The 3D IC according to claim 11, wherein the third bonding structure is arranged between the back side of the second IC die and a back side of the third IC die opposite to the third interconnect structure of the third IC die, and further comprises a second TSV disposed through the third substrate.

17. The 3D IC according to claim 11, wherein a bonding contact is disposed between and in direct contact with the first TSV and a metal line of the third IC die closest to the second IC die.

18. The 3D IC according to claim 11, wherein the third bonding structure further comprises a redistribution layer bonded directly to the first TSV and a bonding contact that connects the redistribution layer to a metal line of the third IC die closest to the second IC die.

19. A three-dimensional (3D) integrated circuit (IC), comprising:
a first IC die comprising a first substrate and a first interconnect structure over the first substrate;
a second IC die comprising a second substrate and a second interconnect structure over the second substrate, wherein the second IC die is bonded to the first IC die by a first bonding structure comprising a first portion contacting the first interconnect structure and a second portion contacting the second interconnection structure;
a first TSV disposed through the second substrate;
a third IC die comprising a third substrate and a third interconnect structure over the third substrate;
a fourth IC die comprising a fourth substrate and a fourth interconnect structure over the fourth substrate, wherein the fourth IC die is bonded to the third IC die by a second bonding structure comprising a first portion contacting the third interconnect structure and a second portion contacting the fourth interconnection structure;
a second TSV through the third substrate; and
wherein the second substrate and the third substrate are bonded through the first TSV and the second TSV;

wherein the first TSV is directly bonded to a bonding contact with an oppositely titled sidewall.

20. The 3D IC according to claim 19, further comprising:
a bonding dielectric layer disposed between the second substrate and the third substrate; and
a bonding metal line disposed within the bonding dielectric layer, the bonding contact separating the bonding metal lines from the first TSV.

* * * * *